US008816398B2

(12) United States Patent
Kiyama et al.

(10) Patent No.: US 8,816,398 B2
(45) Date of Patent: Aug. 26, 2014

(54) SEMICONDUCTOR DEVICE AND METHOD FOR PRODUCING THE SAME

(75) Inventors: Makoto Kiyama, Itami (JP); Yu Saitoh, Itami (JP); Masaya Okada, Osaka (JP); Seiji Yaegashi, Yokohama (JP); Kazutaka Inoue, Yokohama (JP); Mitsunori Yokoyama, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/824,043

(22) PCT Filed: Jul. 6, 2011

(86) PCT No.: PCT/JP2011/065468
§ 371 (c)(1),
(2), (4) Date: Mar. 15, 2013

(87) PCT Pub. No.: WO2012/046480
PCT Pub. Date: Apr. 12, 2012

(65) Prior Publication Data
US 2013/0181255 A1    Jul. 18, 2013

(30) Foreign Application Priority Data
Oct. 6, 2010    (JP) ................................ 2010-226937

(51) Int. Cl.
| H01L 29/66 | (2006.01) |
| H01L 29/778 | (2006.01) |
| H01L 29/15 | (2006.01) |
| H01L 29/423 | (2006.01) |
| H01L 29/06 | (2006.01) |
| H01L 29/20 | (2006.01) |

(52) U.S. Cl.
CPC .......... *H01L 29/778* (2013.01); *H01L 29/7788* (2013.01); *H01L 29/66462* (2013.01); *H01L 29/4236* (2013.01); *H01L 29/155* (2013.01); *H01L 29/0696* (2013.01); *H01L 29/2003* (2013.01); *H01L 29/7789* (2013.01)
USPC ..... 257/194; 257/192; 257/330; 257/E29.253

(58) Field of Classification Search
CPC ....................................................... H01L 29/00
USPC .................. 257/E29.252, E29.262, 183, 194; 438/46
See application file for complete search history.

(56) References Cited

U.S. PATENT DOCUMENTS

| 7,211,839 B2 * | 5/2007 | Kachi et al. .................... 257/194 |
| 2004/0157355 A1 * | 8/2004 | Kachi et al. ...................... 438/46 |
| 2005/0072988 A1 * | 4/2005 | Augusto ......................... 257/192 |
| 2011/0059557 A1 * | 3/2011 | Yamagishi et al. ............... 438/3 |
| 2013/0168739 A1 * | 7/2013 | Kiyama et al. ................. 257/194 |
| 2013/0181226 A1 * | 7/2013 | Saitoh et al. ..................... 257/76 |

FOREIGN PATENT DOCUMENTS

| JP | 2004-260140 | 9/2004 |
| JP | 2006-286942 | 10/2006 |
| JP | 2008-053450 | 3/2008 |
| JP | 2008-192701 | 8/2008 |

OTHER PUBLICATIONS

International Search Report in PCT International Application No. PCT/JP2011/065468 dated Sep. 13, 2011.

* cited by examiner

*Primary Examiner* — Telly Green
(74) *Attorney, Agent, or Firm* — Venable LLP; Michael A. Sartori; Tamatane J. Aga

(57) ABSTRACT

There is provided a vertical GaN-based semiconductor device in which the on-resistance can be decreased while the breakdown voltage characteristics are improved using a p-type GaN barrier layer. The semiconductor device includes a regrown layer 27 including a channel located on a wall surface of an opening 28, a p-type barrier layer 6 whose end face is covered, a source layer 7 that is in contact with the p-type barrier layer, a gate electrode G located on the regrown layer, and a source electrode S located around the opening. In the semiconductor device, the source layer has a superlattice structure that is constituted by a stacked layer including a first layer (a layer) having a lattice constant smaller than that of the p-type barrier layer and a second layer (b layer) having a lattice constant larger than that of the first layer.

8 Claims, 5 Drawing Sheets

SEMICONDUCTOR DEVICE AND METHOD FOR PRODUCING THE SAME

TECHNICAL FIELD

The present invention relates to a semiconductor device used for high power switching and a method for producing the semiconductor device, and particularly to a semiconductor device that uses a GaN-based semiconductor among nitride-based semiconductors and a method for producing the semiconductor device.

BACKGROUND ART

High reverse breakdown voltage and low on-resistance are required for high current switching elements. Field effect transistors (FETs) that use a group III nitride-based semiconductor are excellent in terms of, for example, high breakdown voltage and high-temperature operation because of their wide band gap. Therefore, vertical transistors that use a GaN-based semiconductor have been particularly receiving attention as transistors for controlling high power. For example, PTL 1 and PTL 2 propose a vertical GaN-based FET whose mobility is increased and whose on-resistance is decreased by forming an opening in a GaN-based semiconductor and forming a regrown layer including a channel of two-dimensional electron gas (2DEG) on the wall surface of the opening. In this vertical GaN-based FET, a structure including a p-type GaN barrier layer disposed directly below an $n^+$ source layer is proposed in order to improve the breakdown voltage characteristics.

CITATION LIST

Patent Literature

PTL 1: Japanese Unexamined Patent Application Publication No. 2006-286942
PTL 2: Japanese Unexamined Patent Application Publication No. 2008-192701

SUMMARY OF INVENTION

Technical Problem

In the vertical GaN-based FET, the breakdown voltage characteristics may be improved using the p-type GaN barrier layer. However, Mg serving as an acceptor contained in the p-type GaN barrier layer easily moves and enters the $n^+$ source layer, resulting in an increase in the electrical resistance of the $n^+$ source layer. There are two paths through which electrons move to an electron drift layer (channel) in a wall surface of an opening: (P1) electrons directly move from a source electrode to an electron drift layer and (P2) electrons move from a source electrode to an electron drift layer via a source layer. For example, if Mg enters the $n^+$ source layer and the electrical resistance of the $n^-$ source layer is increased, the electrical resistance of the path (P2) is increased. As a result, the on-resistance of the entire vertical semiconductor device is increased. Therefore, the breakdown voltage characteristics may be improved by disposing the p-type barrier layer, but the on-resistance is increased. The on-resistance and breakdown voltage characteristics are in a tradeoff relationship, and it is difficult to improve both the on-resistance and breakdown voltage characteristics.

It is an object of the present invention to provide a vertical GaN-based semiconductor device in which the on-resistance can be decreased while the breakdown voltage characteristics are improved using a p-type GaN barrier layer.

Solution to Problem

A semiconductor device of the present invention is a vertical semiconductor device including a group III nitride-based stacked layer having an opening. The semiconductor device includes a regrown layer including a channel located so as to cover a wall surface of the opening, a p-type group III nitride-based semiconductor layer (hereinafter referred to as "p-type barrier layer") having an end face covered with the regrown layer at the wall surface of the opening, a group III nitride-based source layer (hereinafter referred to as "source layer") that serves as a top layer of the group III nitride-based stacked layer and is located on the p-type barrier layer, a gate electrode located on the regrown layer in the opening, and a source electrode located on the group III nitride-based stacked layer around the opening so as to be in contact with the regrown layer and the source layer. The regrown layer includes an electron drift layer and an electron source layer and the channel is formed of two-dimensional electron gas (2DEG) generated in the electron drift layer at a position near an interface between the electron drift layer and the electron source layer. The source layer has a superlattice structure that is constituted by a stacked layer including a first layer (a layer) having a lattice constant smaller than that of the p-type barrier layer and a second layer (b layer) having a lattice constant larger than that of the first layer.

According to the above structure, the superlattice structure that constitutes the source layer includes the first layer (a layer) having a lattice constant smaller than that of the p-type barrier layer. Therefore, an acceptor such as Mg does not easily pass through the first layer and the entrance of Mg or the like into the source layer is suppressed. If Mg enters the source layer, the electrical resistance of the source layer increases. Mg or the like also enters the upstream region of the electron drift layer through the source layer having a large contact area with the p-type barrier layer, which disturbs the electron gas flow and increases the electrical resistance.

When the superlattice structure includes the first layer, the entrance of Mg described above can be suppressed. As a result, an increase in the electrical resistance of the path (P2) through which electrons flow from the source electrode to the electron drift layer via the source layer is prevented and thus an increase in the on-resistance of the entire semiconductor device can be prevented.

The two-dimensional electron gas is generated in the second layer at a position near the interface between the first layer and the second layer due to, for example, spontaneous polarization or piezoelectric polarization caused by difference in a crystalline structure and a lattice constant. Consequently, the electrical resistance of the path through which electrons flow from the source electrode to the electron drift layer via the two-dimensional electron gas in the superlattice structure (source layer) can be decreased compared with the conventional case where the $n^-$ source layer is used.

In short, in the present invention, low on-resistance can be achieved due to the following two effects.
(E1) The entrance of Mg or the like from the p-type barrier layer into the source layer and the entrance of Mg or the like from the p-type barrier layer into the upstream region of the electron drift layer via the source layer are made difficult due to the presence of the first layer in the superlattice structure.
(E2) When the superlattice structure includes the first layer having a small lattice constant and the second layer having a lattice constant larger than that of the first layer, two-dimensional electron gas is generated in the second layer at a position near the first layer. By sufficiently increasing the density of the two-dimensional electron gas, the electrical resistance of the source layer can be decreased compared with the conventional case where the $n^+$ source layer is used.

The superlattice structure may be doped with a donor or the like. However, electrons may be scattered by the donor and thus the superlattice structure is desirably undoped or the amount of impurities is desirably decreased. The introduction of impurities is favorably avoided in terms of breakdown voltage characteristics.

In the superlattice structure, when (first layer (a layer)/second layer (b layer)) is assumed to be 1 pair, the number of pairs is not limited. The first layer may be located on the p-type barrier layer or the second layer may be located on the p-type barrier layer. That is, either of the first layer or second layer may be disposed at the bottom so as to be in contact with the p-type barrier layer. In order to suppress the entrance of Mg, the first layer may be located on the p-type barrier layer.

The first layer may be formed of AlN or a GaN-based semiconductor having an Al content higher than that of the second layer, and the second layer may be formed of a GaN-based semiconductor.

Thus, the lattice constant of the first layer can be easily decreased to a value smaller than that of the second layer. As a result, low on-resistance can be achieved due to the two-dimensional electron gas generated by difference in a lattice constant while the entrance of Mg into the source layer is suppressed.

The first layer and/or the second layer may have a thickness of 10 nm or more and 100 nm or less.

Thus, sufficiently high-density two-dimensional electron gas is generated in the second layer at a position near the first layer by generating strong piezoelectric polarization. As a result, the electrical resistance of the path (P2) can be decreased and therefore the on-resistance of the entire semiconductor device can be decreased.

The superlattice structure may be formed by selecting at least one of a material and a thickness that causes no cracking in the superlattice structure and at an interface between the p-type barrier layer and the superlattice structure.

This can prevent the yield of products from being decreased.

The number of pairs of the first layer and second layer stacked may be 1.5 or more.

By stacking two or more pairs of the first layer and second layer, two or more layers including two-dimensional electron gas can be formed and thus the on-resistance can be further decreased. In particular, when the number of pairs is 1.5, the p-type barrier layer is directly covered with a layer having a small lattice constant. Therefore, a layer including two-dimensional electron gas can always be formed while the entrance of Mg or the like is prevented. The number of pairs is not necessarily a natural number, and may be a fraction (the presence of an unpaired a layer or an unpaired b layer).

An insulating layer may be formed on the regrown layer and below the gate electrode.

By disposing an insulating layer below the gate electrode, a gate leak current generated when positive voltage is applied to the gate electrode can be suppressed, which allows high-current operation. Since the threshold voltage can be further shifted in a positive direction, normally-off is easily achieved.

A method for producing a semiconductor device according to the present invention is a method for producing a vertical GaN-based semiconductor device. The production method includes a step of forming a p-type barrier layer on an $n^-$-type GaN-based semiconductor layer (hereinafter referred to as "$n^-$-type drift layer"); a step of forming a group III nitride-based superlattice structure on the p-type barrier layer; a step of forming, by etching, an opening that extends from a top layer to the $n^-$-type drift layer; a step of epitaxially growing a regrown layer in the opening, the regrown layer including an electron drift layer and an electron source layer; and a step of forming a source electrode around the opening so as to be in contact with the regrown layer and the superlattice structure. In the step of forming the superlattice structure, the superlattice structure is formed so as to be constituted by a stacked layer including a first layer having a lattice constant smaller than that of the p-type barrier layer and a second layer having a lattice constant larger than that of the first layer.

By employing the method described above, a vertical semiconductor device having low on-resistance can be easily produced.

Advantageous Effects of Invention

According to the semiconductor device of the present invention, in a vertical GaN-based semiconductor device, low on-resistance can be achieved while the breakdown voltage characteristics are improved using the p-type barrier layer.

DESCRIPTION OF EMBODIMENTS

Figure 1A:
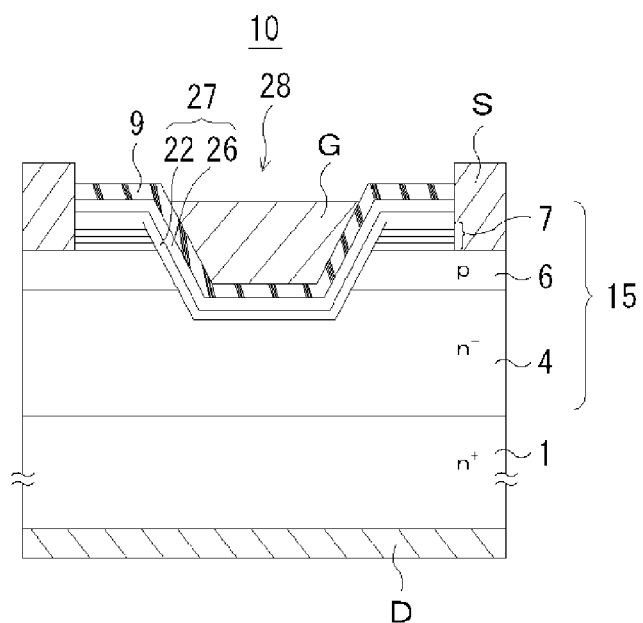
FIG. 1A shows a vertical GaN-based FET (semiconductor device) according to an embodiment of the present invention and is a sectional view taken along line I-I of a plan view shown in FIG. 3.

FIG. 1A is a sectional view of a vertical GaN-based FET (semiconductor device) 10 according to an embodiment of the present invention. The vertical GaN-based FET 10 includes a conductive GaN substrate 1 and $n^-$-type GaN drift layer 4/p-type GaN barrier layer 6/source layer 7 epitaxially grown on the GaN substrate 1. This embodiment is characterized in that the source layer 7 is formed in a superlattice structure.

The n$^-$-type GaN drift layer 4/p-type GaN barrier layer 6/source layer 7 having a superlattice structure is successively formed to constitute a stacked layer 15. A buffer layer composed of an AlGaN layer or GaN layer may be inserted between the GaN substrate 1 and the n$^-$-type GaN drift layer 4 depending on the type of the GaN substrate 1.

The GaN substrate 1 may be a so-called monolithic, thick GaN substrate or a substrate including a GaN layer that is in ohmic contact with a support substrate. In addition, by forming a GaN layer on a GaN substrate or the like during the growth of a GaN-based stacked layer and then removing a portion having a certain thickness corresponding to the thickness of the GaN substrate or the like, only a thin GaN layer may be left as a base in the form of products. The GaN substrate, the substrate including a GaN layer that is in ohmic contact with a support substrate, and the thin GaN layer left as a base in the form of products may be simply referred to as a GaN substrate.

The thin GaN layer left as a base may be a conductive or nonconductive layer and a drain electrode can be disposed on the top or bottom surface of the thin GaN layer depending on the production process and the structure of products. In the case where the GaN substrate, the support substrate, or the like is left in a product, the support substrate or the substrate may be a conductive or nonconductive substrate. When the support substrate or the substrate is a conductive substrate, the drain electrode can be disposed directly on the bottom (lower) surface or top (upper) surface of the support substrate or the substrate. When the support substrate or the substrate is a nonconductive substrate, the drain electrode can be disposed above the nonconductive substrate and on a conductive layer located on the lower layer side in the semiconductor layers.

In this embodiment, the p-type GaN barrier layer 6 is used as the p-type GaN barrier layer, but a p-type AlGaN layer may be used. Regarding other layers constituting the stacked layer 15, other GaN-based semiconductor layers may be used instead of the GaN layers described above, if necessary.

In the stacked layer 15, an opening 28 is formed so as to penetrate the source layer 7 having a superlattice structure and the p-type GaN barrier layer 6 and reach the n$^-$-type GaN drift layer 4. A regrown layer 27 is formed by epitaxial growth so as to cover the wall surface of the opening 28 and the top layer (source layer 7) of the stacked layer 15. The regrown layer 27 is constituted by an intrinsic GaN (i-type GaN) electron drift layer 22 and an AlGaN electron source layer 26. An intermediate layer composed of AlN or the like may be inserted between the i-type GaN electron drift layer 22 and the AlGaN electron source layer 26. A gate electrode G is located above the regrown layer 27 with an insulating layer 9 disposed therebetween. A drain electrode D is located on the bottom surface of the GaN substrate 1. A source electrode S is located on the stacked layer 15 so as to be in contact with the regrown layer 27 and the source layer 7 having a superlattice structure. In FIG. 1A, the side surface of the source electrode S is in contact with the end faces of the regrown layer 27 and source layer 7 having a superlattice structure.

In the semiconductor device according to this embodiment, electrons flow from the source electrode S and (P1) enter the electron drift layer 22 directly or (P2) enter the electron drift layer 22 via the source layer 7 having a superlattice structure. After electrons pass through the path (P1) or (P2), two-dimensional electron gas is formed in the electron drift layer 22 at a position near the interface between the electron drift layer 22 and the electron source layer. The electrons of the two-dimensional electron gas flow in a thickness direction or a vertical direction from the electron drift layer 22 to the drain electrode D through the n$^-$-type GaN drift layer 4. In this path of electrons, the p-type GaN barrier layer 6 is sandwiched between the n$^-$-type GaN drift layer 4 and the source layer 7. The p-type GaN barrier layer 6 raises the band energy of electrons and produces a back-gate effect which, for example, improves breakdown voltage characteristics, thereby providing the following effects (a1) and (a2).

(a1) improvement in breakdown voltage characteristics (a2) improvement in pinch-off characteristics due to the shift of a band in a positive direction Furthermore, in relation to the effect (a1), holes generated at a pn junction between the p-type GaN barrier layer 6 and the n$^-$-type GaN drift layer 4 when a reverse bias is applied can be absorbed. As a result, a reduction in breakdown voltage caused when holes are left is prevented, and thus good breakdown voltage characteristics can be stably provided for a long time.

As described above, the path through which electrons flow from the source electrode S and enter the electron drift layer 22 is divided into the two paths (P1) and (P2). It is estimated that the amount of electrons that pass through the path (P1) is substantially equal to the amount of electrons that pass through the path (P2), though depending on, for example, the thickness of the source layer 7. Therefore, a decrease in the electrical resistance of both the paths directly leads to a decrease in on-resistance. In the present invention, as described above, the source layer 7 is formed in a superlattice structure. The features of the superlattice structure in this embodiment are described in (F1) and (F2) below.

(F1) A first layer or an a layer, which is one of layers in the superlattice structure, is formed of a material having a lattice constant smaller than that of the p-type GaN barrier layer 6. For example, the first layer or a layer is formed of a GaN-based semiconductor having a higher Al content, such as AlGaN, but may be formed of AlN. Since the a layer has a lattice constant smaller than that of the p-type barrier layer, the movement of an acceptor, in particular, Mg is prevented. The lattice constant is a lattice constant at a bottom surface of epitaxial growth. In particular, in a hexagonal system (wurtzite structure) to which group III nitride-based semiconductors such as AlN and GaN belong, the lattice constant is a lattice constant of an a-axis at the bottom surface. That is, for example, the lattice constant of an a-axis of AlGaN is smaller than that of an a-axis of GaN. Thus, passing through in a thickness direction can be effectively suppressed.

In the present invention, as described above, the lattice constant of the a layer, which is one of layers constituting the superlattice structure, is smaller than the lattice constant of the p-type GaN barrier layer 6. As a result, Mg cannot easily pass through the a layer and the adverse effect (described below) caused by Mg can be prevented. A b layer serving as a second layer has a lattice constant larger than that of the a layer so that two-dimensional electron gas is generated due to piezoelectric polarization.

Figure 1B:
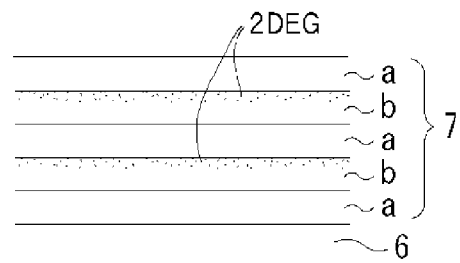
FIG. 1B is a sectional view showing a superlattice structure of the vertical GaN-based FET (semiconductor device) according to an embodiment of the present invention.

FIG. 1B shows the case where the superlattice structure has 2.5 pairs and the a layer is in contact with the p-type GaN barrier layer 6, that is, the case of a superlattice structure in which a layers are located at the bottom and top. In such a superlattice structure, the movement of Mg can be prevented at the edge of the a layer in contact with the p-type GaN barrier layer 6.

Figure 1C:
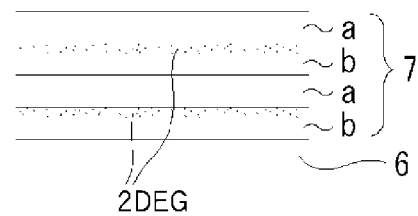
FIG. 1C is a sectional view showing another superlattice structure of the vertical GaN-based FET (semiconductor device) according to an embodiment of the present invention.

FIG. 1C shows the case where the superlattice structure has 2 pairs and the b layer is located at the bottom.

Also in this case, the a layer disposed on the b layer, which is the lowermost layer, prevents the movement of Mg, and thus there is no significant difference between the superlattice structures in FIG. 1B and FIG. 1C.

In the superlattice structure of this embodiment, either of the a layer or b layer may be disposed at the bottom.

(F2) The second layer or b layer of the superlattice structure is formed of a material having a lattice constant larger than that of the a layer. Therefore, two-dimensional electron gas is generated due to piezoelectric polarization in the b layer at a position near the a layer (positive c-axis direction). The density of the two-dimensional electron gas increases in proportion to the degree of piezoelectric polarization. In this embodiment, high-density two-dimensional electron gas is generated, which decreases the electrical resistance of the path (P2) through which electrons flow from the source electrode S and enter the electron drift layer 22 via the source layer having a superlattice structure. As a result, the on-resistance of the entire structure can be decreased.

The superlattice structure may have 1 pair or 1.5 or more pairs. In other words, when (a layer/b layer) is assumed to be 1 pair or 1 period, the superlattice structure may have 1.5 pairs or 1.5 periods, such as (a layer/b layer/a layer) or may have 2 pairs or 2 periods, such as (a layer/b layer/a layer/b layer). The superlattice structure may have 3 or more pairs. As the number of pairs per unit thickness increases, the number of layers including two-dimensional electron gas per unit thickness increases, except for the case of an increase by 0.5 pairs. However, if the thickness of each layer of the superlattice structure is excessively decreased, the electron density of two-dimensional electron gas generated due to piezoelectric polarization is decreased. Therefore, the number of pairs needs to be in an appropriate range.

The entrance of Mg into the superlattice structure scatters the electrons of two-dimensional electron gas and thus increases the on-resistance. Furthermore, Mg enters the upstream region of the electron drift layer 22 through the source layer 7 or the superlattice structure having a large contact area with the p-type GaN barrier layer 6. This considerably hinders the decrease in on-resistance.

In this embodiment, the source layer 7 in the semiconductor device is formed in a superlattice structure (a layer/b layer/a layer/b layer) and the lattice constant of the a layer is decreased so that the movement of Mg is prevented. Therefore, Mg can be prevented from entering the superlattice structure. As a result, the on-resistance can be decreased while the breakdown voltage characteristics and pinch-off characteristics are improved using the p-type GaN barrier layer 6.

Figure 2:
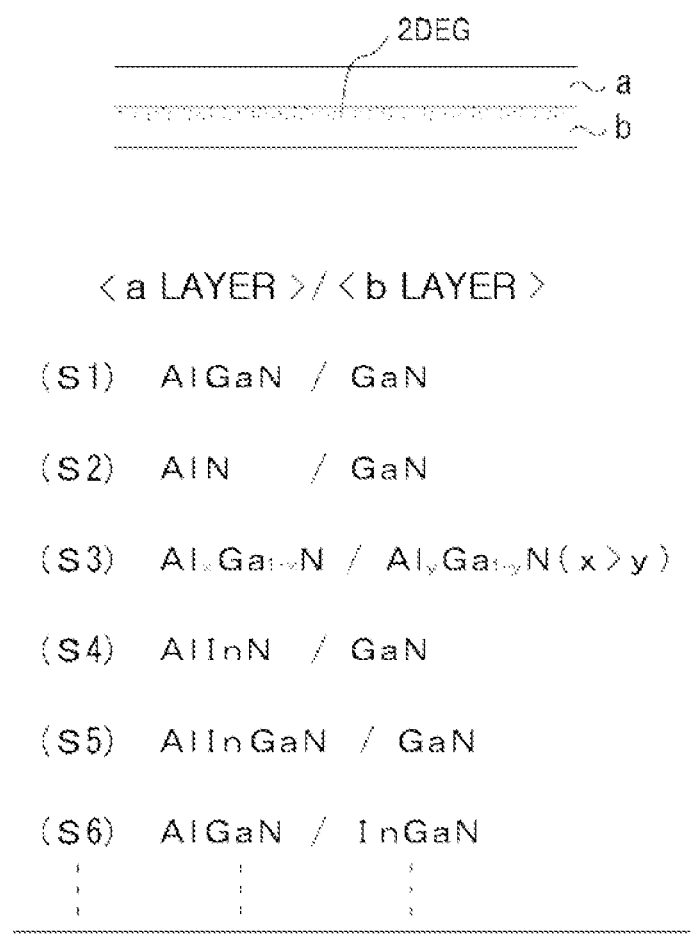
FIG. 2 is a diagram showing the combinations of materials for the superlattice structure.

The a layer and b layer can have the following combinations as exemplified in FIG. 2.

(s1) AlGaN (a layer)/GaN (b layer)
(s2) AlN (a layer)/GaN (b layer)
(s3) $Al_xGa_{1-x}N$ (a layer)/$Al_yGa_{1-y}N$ (b layer): (x>y)

A higher Al content decreases the lattice constant, prevents the movement of Mg, and causes piezoelectric polarization.

(s4) AlInN (a layer)/GaN (b layer)
(s5) AlInGaN (a layer)/GaN (b layer)
(s6) AlGaN (a layer)/InGaN (b layer)

In some of the above combinations, the case where the lattice constant of a GaN-based semiconductor having a high Al content is smaller than that of a GaN-based semiconductor having a low Al content also applies to the case where the Al content has a combination of a finite number and zero.

Combinations other than the combinations (s1) to (s6) may be employed.

The number of pairs may be one or more and is not limited. However, the range of an appropriate number of pairs is automatically determined because of the limitation of the size of a semiconductor device, the lower limit of the thickness of each layer necessary to generate piezoelectric polarization, and the like.

The p-type impurity concentration of the p-type GaN barrier layer 6 may be about $1\times10^{17}$ cm$^{-3}$ to $1\times10^{19}$ cm$^{-3}$. The p-type impurity may be an impurity, such as Mg, that forms an acceptor in a GaN-based semiconductor. The thickness of the p-type GaN barrier layer 6 is dependent on, for example, the thickness of the n$^-$-type GaN drift layer, and thus the range of the thickness cannot be determined in a general manner. However, the typical thickness often used is about 0.3 µm to 1 µm. If the thickness is less than 0.3 µm, the effects (a1) and (a2) cannot be sufficiently produced and thus 0.3 µm may be set as the lower limit of thickness. If the p-type GaN barrier layer 6 having a thickness of about 0.3 µm to 1 µm has an excessively high Mg content, straight movement toward the end face of the p-type GaN barrier layer 6 occurs, which adversely affects the channel. The reverse voltage characteristics (breakdown voltage characteristics) at a pn junction between the p-type GaN barrier layer 6 and the n$^-$-type GaN drift layer during channel off are also degraded.

The thickness of the source layer 7 may be about 0.1 µm to 0.6 µm. Based on this thickness, the thickness of the a layer constituting the superlattice structure may be 10 nm (0.01 µm) or more and 100 nm (0.1 µm) or less. The b layer may also have substantially the same thickness. The source layer 7 having a superlattice structure favorably remains undoped and a donor should not be intentionally added. This is because the presence of a donor disturbs the flow of electron gas and thus may increase the on-resistance.

The length of the source layer 7 may be 0.5 µm or more and 5 µm or less. The source layer 7 is relatively long, and thus the use of a conventional n$^+$-type GaN source layer having a high donor concentration reaches the limits of the decrease in electrical resistance. By employing the superlattice structure to provide sufficiently high-density two-dimensional electron gas as in this embodiment, the electrical resistance of the path (P2) through which electrons flow from the source electrode S to the electron drift layer 22 via the source layer 7 can be considerably decreased. As a result, the on-resistance of the entire semiconductor device 10 can be decreased.

Figure 3:
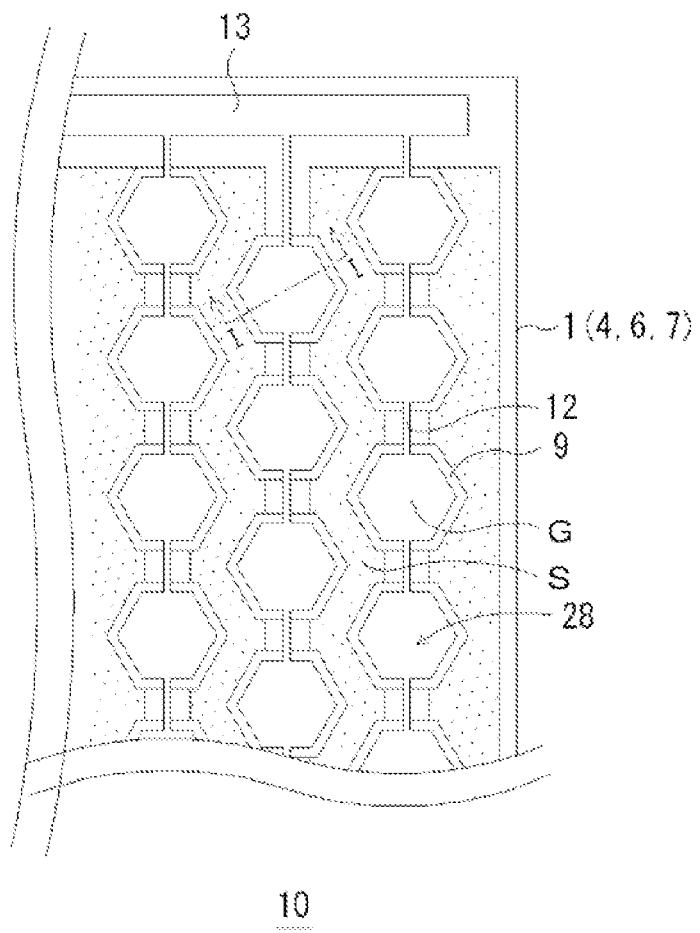
FIG. 3 is a plan view of the semiconductor device shown in FIG. 1A.

FIG. 3 is a plan view of the vertical GaN-based semiconductor device 10 shown in FIG. 1A, and FIG. 1A is a sectional view taken along line I-I of FIG. 3. Referring to FIG. 3, the opening 28 and the gate electrode G have a hexagonal shape and a region around the gate electrode G is substantially covered with the source electrode S while the source electrode S does not overlap a gate wiring line 12. Consequently, a closest-packed structure (honey-comb structure) is formed and thus the gate electrode G has a long perimeter per unit area. By employing such a shape, the on-resistance can also be decreased. An electric current flows from the source electrode S and enters a channel (electron drift layer 22) in the regrown layer 27 (P1) directly or (P2) through the source layer 7 having a superlattice structure. Then, the electric current flows to the drain electrode D through the n$^-$-type GaN drift layer 4. In order to prevent the source electrode S and the wiring line thereof from interfering with a gate structure including the gate electrode G, the gate wiring line 12, and a gate pad 13, the source wiring line is disposed on an interlayer-insulating layer (not shown). A via hole is formed in the interlayer-insulating layer, and the source electrode S including a conductive portion obtained by filling the via hole is electrically connected to a source conductive layer (not shown) on the interlayer-insulating layer. As a result, a source structure including the source electrode S can have low electrical resistance and high mobility, which are suitable for high-power elements.

The perimeter of openings per unit area can also be increased by densely arranging elongated openings instead of employing the hexagonal honey-comb structure. Consequently, the current density can be improved.

Figure 4:
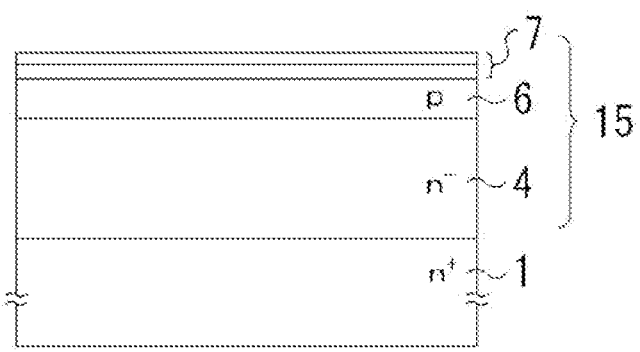
FIG. 4 is a diagram showing a method for producing the vertical GaN-based FET in FIG. 1A, the diagram showing the state in which a stacked layer including layers up to a source layer has been formed on a substrate including a GaN layer that is in ohmic contact with a support substrate.

A method for producing the semiconductor device 10 according to this embodiment will be described. As shown in FIG. 4, a stacked layer 15 including n⁻-type GaN drift layer 4/p-type GaN barrier layer 6/source layer 7 having a superlattice structure is grown on a GaN substrate 1 corresponding to the above-described GaN substrate. A GaN-based buffer layer (not shown) may be inserted between the GaN substrate 1 and the n⁻-type GaN drift layer 4.

The formation of the above layers may be performed by metal-organic chemical vapor deposition (MOCVD) or the like. By performing growth using MOCVD, a stacked layer 15 having good crystallinity can be formed. In the case where the GaN substrate 1 is formed by growing a gallium nitride film on a conductive substrate using MOCVD, trimethylgallium is used as a gallium raw material. High-purity ammonia is used as a nitrogen raw material. Purified hydrogen is used as a carrier gas. The purity of the high-purity ammonia is 99.999% or more and the purity of the purified hydrogen is 99.999995% or more. A hydrogen-based silane may be used as a Si raw material for an n-type dopant (donor) and cyclopentadienyl magnesium may be used as a Mg raw material for a p-type dopant (acceptor).

A conductive gallium nitride substrate having a diameter of two inches is used as the conductive substrate. The substrate is cleaned at 1030° C. at 100 Torr in an atmosphere of ammonia and hydrogen.

Subsequently, the temperature is increased to 1050° C. and a gallium nitride layer is grown at 200 Torr at a VIII ratio of 1500. The formation method of the GaN layer on the conductive substrate is employed for not only the formation of the GaN substrate 1 but also the growth of the stacked layer 15 on the GaN substrate 1.

By employing the above-described method, the n⁻-type GaN drift layer 4/p-type GaN barrier layer 6/source layer 7 having a superlattice structure is grown on the GaN substrate 1 in that order.

Obviously, it is important to continuously grow all the layers of the superlattice structure from the beginning to the end. This is because the contamination with oxygen or the like in the air results in the formation of impurity level, which disturbs electron gas flow and thus increases the electrical resistance. The a layer and b layer are each formed with a thickness of 10 nm or more and 100 nm or less and may remain undoped. The number of pairs is, for example, two. Thus, the number of layers including two-dimensional electron gas can be set to be two, which is advantageous in terms of decrease in on-resistance.

Figure 5:
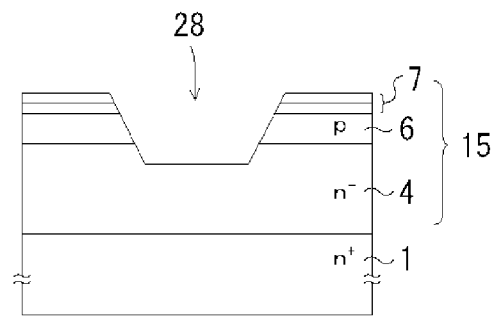
FIG. 5 is a diagram showing the state in which an opening has been formed by etching.
Figure 6A:
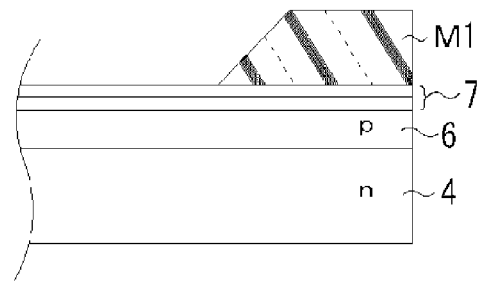
FIG. 6A is a diagram showing the state in which, at the stage of forming an opening by RIE, a resist pattern has been formed.
Figure 6B:
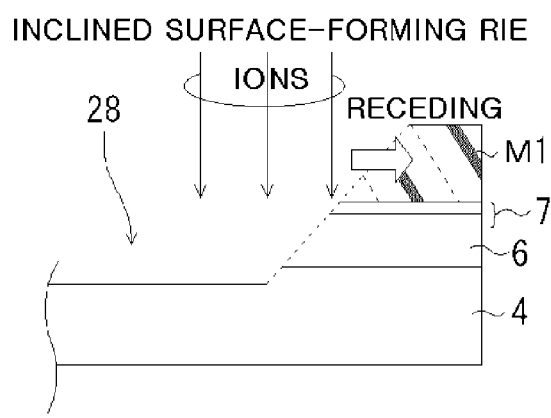
FIG. 6B is a diagram showing the state in which, at the stage of forming an opening by RIE, the stacked layer is etched down by performing ion irradiation and an opening is expanded (caused to recede).

Subsequently, as shown in FIG. 5, an opening 28 is formed by reactive ion etching (RIE). As shown in FIGS. 6A and 6B, a resist pattern M1 is formed on the top of epitaxial layers 4, 6, and 7. The resist pattern M1 is then etched by RIE to cause the resist pattern M1 to recede, whereby an opening is expanded to form an opening 28. In this RIE process, the inclined surface of the opening 28, that is, the end face of the stacked layer 15 is damaged by being subjected to ion irradiation. In the damaged portion, for example, a high-density region of dangling bonds and lattice defects is formed. Conductive impurities derived from an RIE equipment or unspecified sources reach the damaged portion and thus enrichment occurs. The formation of the damaged portion results in an increase in drain leak current and thus the restoration needs to be performed. When hydrogen and ammonia are contained at certain levels, the restoration regarding the dangling bonds and the like, the removal of the impurity, and passivation can be achieved during the growth of a regrown layer 27 described below.

Figure 7:
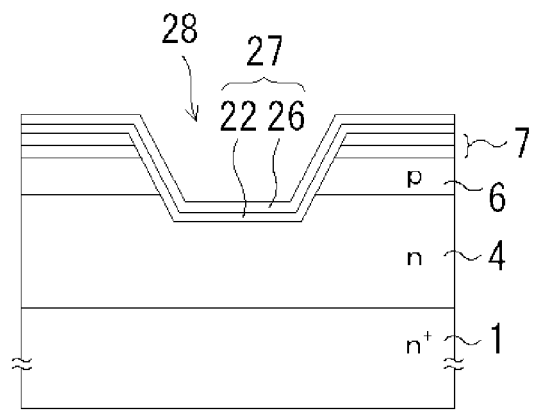
FIG. 7 is a diagram showing the state in which a regrown layer has been formed in the opening.

Subsequently, the resist pattern M1 is removed and the wafer is cleaned. The wafer is inserted into an MOCVD apparatus and a regrown layer 27 including an electron drift layer 22 composed of undoped GaN and an electron source layer 26 composed of undoped AlGaN is grown as shown in FIG. 7. In the growth of the undoped GaN layer 22 and undoped AlGaN layer 26, thermal cleaning is performed in an atmosphere of ($NH_3+H_2$), and then an organic metal material is supplied while ($NH_3+H_2$) is being introduced. In the thermal cleaning before the formation of the regrown layer 27 or in the formation of the regrown layer 27, the restoration regarding the damaged portion, the removal of the conductive impurity, and passivation are allowed to proceed.

Figure 8:
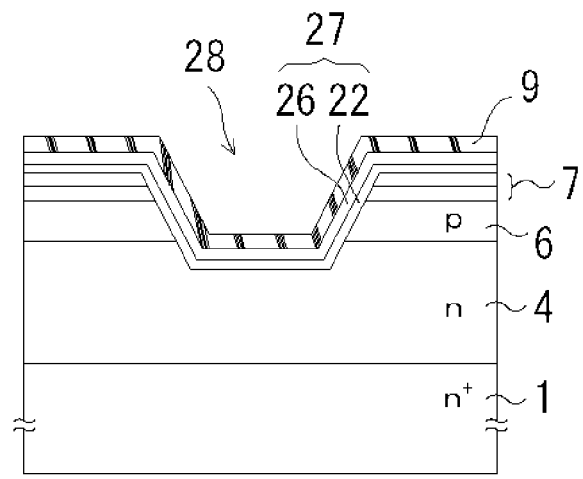
FIG. 8 is a diagram showing the state in which an insulating layer has been grown on the regrown layer.

Subsequently, the wafer is taken out of the MOCVD apparatus. An insulating layer 9 is grown as shown in FIG. 8. A source electrode S and a drain electrode D are formed on the top surface of the epitaxial layer and the bottom surface of the GaN substrate 1, respectively, by photolithography and electron beam deposition as shown in FIG. 1A. A gate electrode G is further formed on the side surface of the opening 28.

EXAMPLES

The vertical GaN-based semiconductor device (transistor) shown in FIG. 1A was produced and the source-gate resistance $R_{sg}$, which is a constituent element of on-resistance, was measured. The on-resistance is the total of source electrode resistance, source-gate resistance, channel resistance, drift layer resistance, and substrate resistance. The source-gate resistance $R_{sg}$ can be considerably decreased by using the source layer having a superlattice structure.

The specific structure is described below.

Invention Example A

The structure formed was GaN substrate 1/n⁻-type GaN drift layer 4/p-type GaN barrier layer 6/source layer 7 having a superlattice structure. The superlattice structure had two pairs of (AlGaN (a layer)/GaN (b layer)). The AlGaN layer (a layer) was disposed on the upper side and the GaN (b layer) was disposed on the lower side (the structure shown in FIG. 1C). The content of Al in AlGaN was set to be 0.2, and the thicknesses of AlGaN and GaN were set to be 30 nm. This means that the source layer 7 had a thickness of 120 nm (0.12 μm).

The p-type GaN barrier layer had a thickness of 1.0 μm and a Mg concentration of $3 \times 10^{18}$ cm⁻³. The n⁻-type GaN drift layer had a thickness of 5.0 μm and a carrier concentration of $7 \times 10^{15}$ cm⁻³.

Mesa etching was then performed by RIE to grow a regrown epitaxial layer (GaN: thickness 100 nm/$Al_{0.2}Ga_{0.8}N$: thickness 20 nm). A source electrode, a drain electrode, and a gate electrode were formed through an electrode process.

Comparative Example B

The same shape and size as in Invention Example A were employed. A conventional n⁺-type GaN source layer containing an n-type impurity was used as the source layer and the thickness of the source layer was set to be 0.12 µm, which was the same as in Invention Example A. Si was used as a donor of the n+-type GaN source layer and the donor concentration was set to be $3 \times 10^{18}$ cm$^{-3}$. The other structures were the same as in Invention Example A.

The source-gate resistance $R_{sg}$ of the test specimens of Invention Example A and Comparative Example B was measured by transmission line model (TLM) method. Table shows the results.

TABLE

| Test specimen | Source-gate resistance Rsg (Ω/sq.) |
|---|---|
| Invention Example A | 200 |
| Comparative Example B | 400 |

According to Table, the source-gate resistance $R_{sg}$ in Invention Example A is reduced by half to 200 Ω/sq. from 400 Ω/sq., which is the source-gate resistance $R_{sg}$ in Comparative Example B. As is clear from this, the on-resistance can be decreased when the source layer 7 has a superlattice structure that satisfies the above-described lattice constant.

The structures disclosed in the above embodiments of the present invention are mere examples and the scope of the present invention is not limited to these embodiments. The scope of the present invention is defined by the appended claims, and all changes that fall within the scope of the claims and the equivalence thereof are therefore embraced by the claims.

INDUSTRIAL APPLICABILITY

According to the semiconductor device or the like of the present invention, in a vertical GaN-based semiconductor device, the on-resistance can be decreased while the breakdown voltage characteristics are improved due to the presence of a p-type barrier layer. Accordingly, it is expected that the semiconductor device of the present invention is used in the applications of power devices.

REFERENCE SIGNS LIST

1 GaN substrate
4 n−-type GaN drift layer
6 p-type GaN barrier layer
7 source layer having superlattice structure
9 insulating layer
10 semiconductor device (vertical GaN-based FET)
12 gate wiring line
13 gate pad
15 stacked layer
22 GaN electron drift layer
26 AlGaN electron source layer
27 regrown layer
28 opening
S source electrode
G gate electrode
D drain electrode
M1 resist pattern

The invention claimed is:

1. A vertical semiconductor device including a group III nitride-based stacked layer having an opening, the semiconductor device comprising:
a regrown layer including a channel located so as to cover a wall surface of the opening;
a p-type group III nitride-based semiconductor layer having an end face covered with the regrown layer at the wall surface of the opening;
a group III nitride-based source layer that serves as a top layer of the group III nitride-based stacked layer and is located on the p-type group III nitride-based semiconductor layer;
a gate electrode located on the regrown layer in the opening; and
a source electrode located on the group III nitride-based stacked layer around the opening so as to be in direct contact with the regrown layer and the group III nitride-based source layer,
wherein the regrown layer includes an electron drift layer and an electron source layer and the channel is formed of two-dimensional electron gas generated in the electron drift layer at a position near an interface between the electron drift layer and the electron source layer, and
the group III nitride-based source layer has a superlattice structure that is constituted by a stacked layer including a first layer having a lattice constant smaller than that of the p-type group III nitride-based semiconductor layer and a second layer having a lattice constant larger than that of the first layer.

2. The semiconductor device according to claim 1, wherein the first layer is formed of AlN or a GaN-based semiconductor having an Al content higher than that of the second layer, and the second layer is formed of a GaN-based semiconductor.

3. The semiconductor device according to claim 1, wherein at least one of the first layer and second layer has a thickness of 10 nm or more and 100 nm or less.

4. The semiconductor device according to claim 1, wherein the superlattice structure is formed by selecting at least one of a material and a thickness that causes no cracking in the superlattice structure and at an interface between the p-type group III nitride-based semiconductor layer and the superlattice structure.

5. The semiconductor device according to claim 1, wherein the number of pairs of the first layer and second layer stacked is 1.5 or more.

6. The semiconductor device according to claim 1, wherein an insulating layer is formed on the regrown layer and below the gate electrode.

7. A method for producing a vertical GaN-based semiconductor device, the method comprising:
a step of forming a p-type GaN-based semiconductor layer on an n−-type GaN-based semiconductor layer;
a step of forming a group III nitride-based superlattice structure on the p-type GaN-based semiconductor layer;
a step of forming, by etching, an opening that extends from a top layer to the n−-type GaN-based semiconductor layer;
a step of epitaxially growing a regrown layer in the opening, the regrown layer including an electron drift layer and an electron source layer; and
a step of forming a source electrode around the opening so as to be in direct contact with the regrown layer and the superlattice structure,
wherein, in the step of forming the superlattice structure, the superlattice structure is formed so as to be constituted by a stacked layer including a first layer having a lattice constant smaller than that of the p-type GaN-based semiconductor layer and a second layer having a lattice constant larger than that of the first layer.

8. The method for producing a semiconductor device according to claim 7, wherein the superlattice structure is formed so that the number of pairs of the first layer and second layer is 1 or 2 or more.

* * * * *